United States Patent
Yoneya

(10) Patent No.: US 7,558,189 B2
(45) Date of Patent: Jul. 7, 2009

(54) IMAGE SIGNAL CANCEL-TYPE HETERODYNE RECEPTION METHOD AND DIRECT CONVERSION ORTHOGONAL FREQUENCY DIVISION MULTIPLEXING RECEPTION METHOD

(75) Inventor: Akihiko Yoneya, Aichi (JP)

(73) Assignee: Nagoya Industrial Science Research Institute, Nagoya-shi (JP)

( * ) Notice: Subject to any disclaimer, the term of this patent is extended or adjusted under 35 U.S.C. 154(b) by 841 days.

(21) Appl. No.: 10/511,830

(22) PCT Filed: Apr. 18, 2003

(86) PCT No.: PCT/JP03/05020

§ 371 (c)(1),
(2), (4) Date: Oct. 20, 2004

(87) PCT Pub. No.: WO03/090368

PCT Pub. Date: Oct. 30, 2003

(65) Prior Publication Data

US 2005/0174928 A1    Aug. 11, 2005

(30) Foreign Application Priority Data

Apr. 22, 2002    (JP)    ............................. 2002-119483

(51) Int. Cl.
*H04J 9/00*    (2006.01)
*H04J 11/00*    (2006.01)
*H04B 1/00*    (2006.01)

(52) U.S. Cl. ........................ 370/204; 370/208; 375/144

(58) Field of Classification Search ......... 370/203–211; 455/207–209, 313–316, 324

See application file for complete search history.

(56) References Cited

U.S. PATENT DOCUMENTS 5,870,669 A * 2/1999 Kawai ........................ 455/209
6,334,051 B1 * 12/2001 Tsurumi et al. ............. 455/324

(Continued)

FOREIGN PATENT DOCUMENTS

JP    06-077852    3/1994

(Continued)

OTHER PUBLICATIONS

Jan Crols, "A Single-Chip 900 MHz CMOS Receiver Front-End with a High Performance Low-IF Topology", 1995, IEEE Journal of Solid-State Circuits, vol. 30, No. 12, Dec. 1995, pp. 1483-1492.*

*Primary Examiner*—Tri H Phan
(74) *Attorney, Agent, or Firm*—Oblon, Spivak, McClelland, Maier & Neustadt, P.C.

(57) ABSTRACT

According to an image signal cancel-type heterodyne reception method, I-phase and Q-phase intermediate-frequency signals can be modulated using two orthogonal signals, superimposed one on the other, amplified by one amplifier, and modulated using two modulated orthogonal signals, thereby amplifying I-phase and Q-phase signals by one amplifier. Therefore, it is possible to obtain a high image signal cancellation ratio with no difference in gain for both of the phases. According to a direct conversion orthogonal frequency division reception method, on the other hand, two-phase base-band signals can be amplified respectively by one amplifier to eliminate a difference in gain between amplifications of the two-phase base-bands, thereby realizing high non-interference between sub-carriers.

6 Claims, 14 Drawing Sheets

U.S. PATENT DOCUMENTS

2002/0127982 A1 * 9/2002 Haapoja et al. ............ 455/130

FOREIGN PATENT DOCUMENTS

| JP | 07-095110 | 4/1995 |
| JP | 08-149170 | 6/1996 |
| JP | 09-074366 | 3/1997 |
| JP | 09-149092 | 6/1997 |
| JP | 09-261101 | 10/1997 |
| JP | 11-234650 | 8/1999 |
| JP | 11-317777 | 11/1999 |

* cited by examiner

LO: Local Oscillator
DEM: DEModulator
MIX: MIXer
FFT: Fast Fourier Transferm

Band-pass filter
Amplifier

IMAGE SIGNAL CANCEL-TYPE HETERODYNE RECEPTION METHOD AND DIRECT CONVERSION ORTHOGONAL FREQUENCY DIVISION MULTIPLEXING RECEPTION METHOD

TECHNICAL FIELD

The present invention relates to an image signal cancel-type heterodyne reception method and a direct conversion orthogonal frequency division multiplexing reception method.

BACKGROUND OF THE INVENTION

A conventional image signal cancel-type heterodyne reception method is such as shown in FIG. 16. That is, from high-frequency signal received by an antenna etc., a signal having a necessary frequency band is taken out by a band-pass filter 41, amplified by a high-frequency amplifier 31, and supplied to mixers 21a and 21b. A first local oscillator 11 oscillates a signal for converting the received high-frequency signal into an intermediate-frequency signal, which oscillated signal is converted by a phase shifter 51 into two-phase signals whose phases are shifted by 90° from each other, which two signals are supplied to the mixers 21a and 21b respectively. The mixers 21a and 21b mix the amplified high-frequency signal and the respective two-phase signals output from the phase shifter 51, so that signals whose frequencies are differences between the frequencies of these signals respectively are taken out as two-phase signals. Output signals of the mixers 21a and 21b are input to band-pass filters 42a 42b respectively, which only a signal desired to be received and its image signal pass through as intermediate-frequency amplifier input signals 94a and 94b.

The intermediate-frequency amplifier input signals 94a and 94b are amplified by intermediate-frequency amplifiers 32a and 32b to generate intermediate-frequency amplifier output signals 95a and 95b, respectively. The intermediate-frequency amplifier output signals 95a and 95b are modulated at a modulator 53 by using two-phase local oscillator output signals 92a and 92b output from a second local oscillator 13 to cancel the image signal, thus providing base-band signals 96a and 96b for the desired receive signal. The base-band signals 96a and 96b are input to a demodulator 61, where a digital signal is demodulated.

An image signal cancel-type heterodyne reception method is referred to also as a low-IF method and has a merit as a heterodyne method and such an additional merit that the band-pass filters 42a and 42b, which are an intermediate-frequency filter, can be realized easily especially from a viewpoint of downsizing. In the image signal cancel-type heterodyne reception method, it is necessary to amplify each of the intermediate-frequency amplifier input signals 94a and 94b, which are two-phase intermediate frequency signals, that have been amplified by the different amplifiers 32a and 32b conventionally.

However, in a conventional image signal cancel-type heterodyne reception method, it is necessary to use a variable-gain amplifier as each of the amplifiers 32a and 32b, which are an intermediate-frequency amplifier, so that when two-phase intermediate-frequency signals are amplified by the different amplifiers 32a and 32b, it has been difficult to make accurately coincident with each other gains of the amplifiers 32a and 32b, which are two variable-gain amplifiers respectively. Because of this, in the conventional image signal cancel-type heterodyne reception method, it has been difficult to realize a high image signal cancellation ratio.

Further, a conventional direct conversion orthogonal frequency division multiplexing reception method is such as shown in FIG. 17. That is, from high-frequency signal received by an antenna etc., a signal having a necessary frequency band is taken out by a band-pass filter 41, amplified by a high-frequency amplifier 31, and supplied to mixers 21a and 21b. A first local oscillator 11 oscillates a signal for converting the received high-frequency signal into a base-band signal, which oscillated signal is converted by a phase shifter 51 into two-phase signals whose phases are shifted by 90° from each other, which two signals are supplied to the mixers 21a and 21b respectively. The mixers 21a and 21b mix the amplified high-frequency signal and the two-phase signals output from the phase shifter 51 respectively, so that the base-band signals are taken out as two-phase signals. Output signals of the mixers 21a and 21b are input to band-pass filters 42a 42b, which only a signal having a desired band signal passes through, thus providing base-band signals 98a and 98b.

The base-band signals 98a and 98b are amplified by the amplifiers 32a and 32b to generate two-phase base-band output signals 90a and 90b, respectively. The base-band output signals 90a and 90b undergo sampling and FFT operations at fast-Fourier transform operator (hereinafter abbreviated as FFT operator) 62. An output of the FFT operator 62 is sent to a demodulator 64, which outputs a decided symbol as output data.

A direct conversion orthogonal frequency division multiplexing reception method has a merit that a receiving set can be downsized easily. In the direct conversion orthogonal frequency division multiplexing reception method, it is necessary to amplify two-phase base-band signals differently from each other, which signals have been amplified by the different amplifiers 32a and 32b conventionally.

In the direct conversion orthogonal frequency division multiplexing reception method, it is necessary to use a variable-gain amplifier as each of the amplifiers 32a and 32b, which are a base-band amplifier, so that when two-phase base-band signals are amplified by the different amplifiers 32a and 32b, it has not been so easy to make accurately coincident with each other gains of the amplifiers 32a and 32b, which are two variable-gain amplifiers respectively. Such non-coincidence in gain causes interference between sub-carriers when a signal modulated by orthogonal frequency division multiplexing (hereinafter abbreviated as OFDM) is received, so that it has been necessary and troublesome to make these gains uniform to some extent. Further, a non-coincident error between these gains has deteriorated non-interference between the sub-carriers.

This phenomenon is described as follows. FIG. 17 shows a configuration of a conventional direct conversion orthogonal frequency division multiplexing reception method. A high-frequency signal modulated by OFDM is converted by mixers 21a and 21b into base-band signals 98a and 98b respectively. It is supposed that a value of a signal modulated for a sub-carrier having frequency (fc+f1) is sa and that of a signal modulated for a sub-carrier having frequency (fc−f1) is sb. Note that sa and sb are a complex number. Frequency-f1 components contained in the base-band signals 98a and 98b are given by the following equation 1 by using appropriate complex numbers pa and pb respectively.

$$Re\{p\ a^*s\ a+p\ b^*s\ b\}+j^*Im\{p\ a^*s\ a-p\ b^*s\ b\}$$

$$Re\{p\ a^*s\ a-p\ b^*s\ b\}-j^*Im\{p\ a^*s\ a+p\ b^*s\ b\} \qquad [\text{Equation 1}]$$

In Equation 1, j indicates a purely imaginary number and * indicates multiplication, which holds true also in the following. Further, Re and Im indicate a real part and an imaginary part in { } respectively, which holds true also in the following.

If phasing occurs at the time of high-frequency signal reception, values of the complex numbers pa and pb change. In some cases, either one of these values is reduced extremely. Supposing gains of amplifiers 32a and 32b to be ga and gb (both of which are a real number) respectively, components of (fc+f1) and (fc−f1) calculated by an FFT operator 62 are represented by the following equation 2:

$$(g\,a+g\,b)*p\,a*s\,a+(g\,a-g\,b)*p\,b*s\,b,$$

$$(g\,a-g\,b)*p\,a*s\,a+(g\,a+g\,b)*p\,b*s\,b \qquad \text{[Equation 2]}$$

Therefore, if values of ga and gb can be made uniform accurately, it is possible to reproduce in a non-interfering manner the signal modulated for the sub-carrier having frequency (fc+f1) and the signal modulated for the sub-carrier having frequency (fc−f1). However, if the values ga and gb have a deviance, interference occurs to make it impossible to separate these signals from each other accurately.

SUMMARY OF THE INVENTION

It is an object of the present invention to provide an image signal cancel-type heterodyne reception method that can inexpensively realize a high image signal cancellation ratio using a simple configuration. It is another object of the present invention to provide a direct conversion orthogonal frequency division multiplexing reception method that can realize non-interference between sub-carriers easily.

A first feature of the present invention comprises the steps of: mixing a high-frequency signal received by an antenna etc. and amplified with locally oscillated two-phase output signals of a first local oscillator which have different phases, to generate two-phase intermediate-frequency signals; summing the modulated two-phase intermediate-frequency signals by two modulating orthogonal signals which are orthogonal to each other to the two-phase intermediate-frequency signals, to generate one synthesized signal; amplifying the synthesized signal to generate an intermediate-frequency amplifier output signal; and modulating the each intermediate-frequency amplifier output signal by using the modulating orthogonal signals and mixing them with locally oscillated two-phase output signals of a second local oscillator which have different phases, to generate desired base-band signals from which image signals have been canceled, thus demodulating the base-band signals.

Note that it is also possible to simultaneously receive signals of two frequency bands which act as an image signal to each other.

A second feature of the present invention comprises the steps of: mixing a high-frequency signal received by an antenna etc. and amplified with locally oscillated two-phase output signals of a first local oscillator which have different phases, to generate two-phase intermediate-frequency signals; summing the modulated two-phase intermediate-frequency signals by two modulating orthogonal signals which are orthogonal to each other, to generate one synthesized signal; amplifying the synthesized signal to generate an intermediate-frequency amplifier output signal; and modulating the intermediate-frequency amplifier output signal by using signals obtained by modulating two-phase output signals of a second local oscillator which have different phases by using the modulating orthogonal signals, to generate a desired base-band signal from which an image signal has been canceled, thus demodulating the base-band signal.

Note that it is also possible to simultaneously receive signals of two frequency bands which act as an image signal to each other.

Further, in the present invention, it is possible to use rectangular waves or sine waves whose phases are shifted by 90° from each other, as the two modulating orthogonal signals which are orthogonal to each other.

Furthermore, in the present invention, it is also possible to use two-valued signals having sequences {1, −1, 1, −1, 1, 1, −1, −1} and {1, 1, −1, −1, 1, −1, 1, −1} respectively, as the two modulating orthogonal signals which are orthogonal to each other.

With the first and second features, by amplifying two-phase intermediate-frequency signals by one amplifier, it is possible to eliminate a difference in gain between the amplified two-phase intermediate-frequency signals, thereby realizing a high image signal cancellation ratio in an image signal cancel-type heterodyne reception method. To amplify two input signals by one amplifier, two signals which are orthogonal to each other are used to modulate the two input signals, resultant outputs of which are added up and amplified by the one amplifier, an output signal of the amplifier is modified using the mutually orthogonal two signals, to obtain amplified signals for the respective input signals.

A third feature of the present invention comprises the steps of: modulating a high-frequency signal modulated by orthogonal frequency division multiplexing, by using two-phase output signals of a local oscillator whose frequencies are equal to a center frequency of a receive signal and whose phases are shifted by 90° from each other, to generate two-phase base-band signals; summing the modulated two-phase base-band signals by two modulating orthogonal signals which are orthogonal to each other, to generate one synthesized signal; amplifying the synthesized signal to generate a synthesized-signal amplifier output signal; modulating the synthesized-signal amplifier output signal by using the modulating orthogonal signals; and based on a result of performing Fourier transform on the modulated synthesized-signal amplifier output signal, performing demodulation against the orthogonal frequency division multiplexing.

A fourth feature of the present invention comprises the steps of: modulating a high-frequency signal modulated by orthogonal frequency division multiplexing, by using two-phase output signals of a local oscillator whose frequencies are equal to a center frequency of a receive signal and whose phases are shifted by 90° from each other, to generate two-phase base-band signals; summing the modulated two-phase base-band signals by two modulating orthogonal signals which are orthogonal to each other, to generate one synthesized signal; amplifying the synthesized signal to generate a synthesized-signal amplifier output signal; and based on a result of performing Fourier transform on the synthesized-signal amplifier output signal, performing demodulation against the orthogonal frequency division multiplexing.

Note that it is possible to use three-valued signals having sequences {0, 1, 0, −1} and {1, 0, −1, 0} respectively, as the two modulating orthogonal signals which are orthogonal to each other.

With the third and fourth features, by amplifying two-phase base-band signals by one amplifier, it is possible to eliminate a difference in gain between the amplified two-phase base-band signals, thereby realizing a high non-interference between sub-carriers in a direct conversion orthogonal frequency division multiplexing reception method. Means for amplifying two input signals by one amplifier, two signals which are orthogonal to each other are used to modulate the two input signals, resultant outputs of which are added up and amplified by the one amplifier, an output signal (synthesized output signal) of the amplifier is modified using the mutually orthogonal two signals, to obtain amplified signals for the respective input signals.

Further, by converting a signal line of the above-mentioned mutually orthogonal two signals into a line of two-valued signals having sequences {0, 1, 0, −1} and {1, 0, −1, 0} respectively, cross-talk in amplification of a sine component and a cosine component of a receive signal appears as phase rotation of the receive signal and so has no influence on processing of the receive signal essentially.

Furthermore, since the signal rate of the line of two-valued signals having sequences {0, 1, 0, −1} and {1, 0, −1, 0} respectively which is given as the signal line of the above-mentioned mutually orthogonal two signals is at least four times of a maximum sub-carrier frequency of an OFDM signal to be received, a synthesized output signal has a frequency of a base-band signal shifted by ¼ times of the signal rate of the two-valued signal line and so can be used as a one-side frequency band signal, so that by subjecting the synthesized output signal to Fourier transform, demodulation can be performed against OFDM.

DETAILED DESCRIPTION OF PREFFERED EMBODIMENTS

1. First Embodiment

Figure 1:
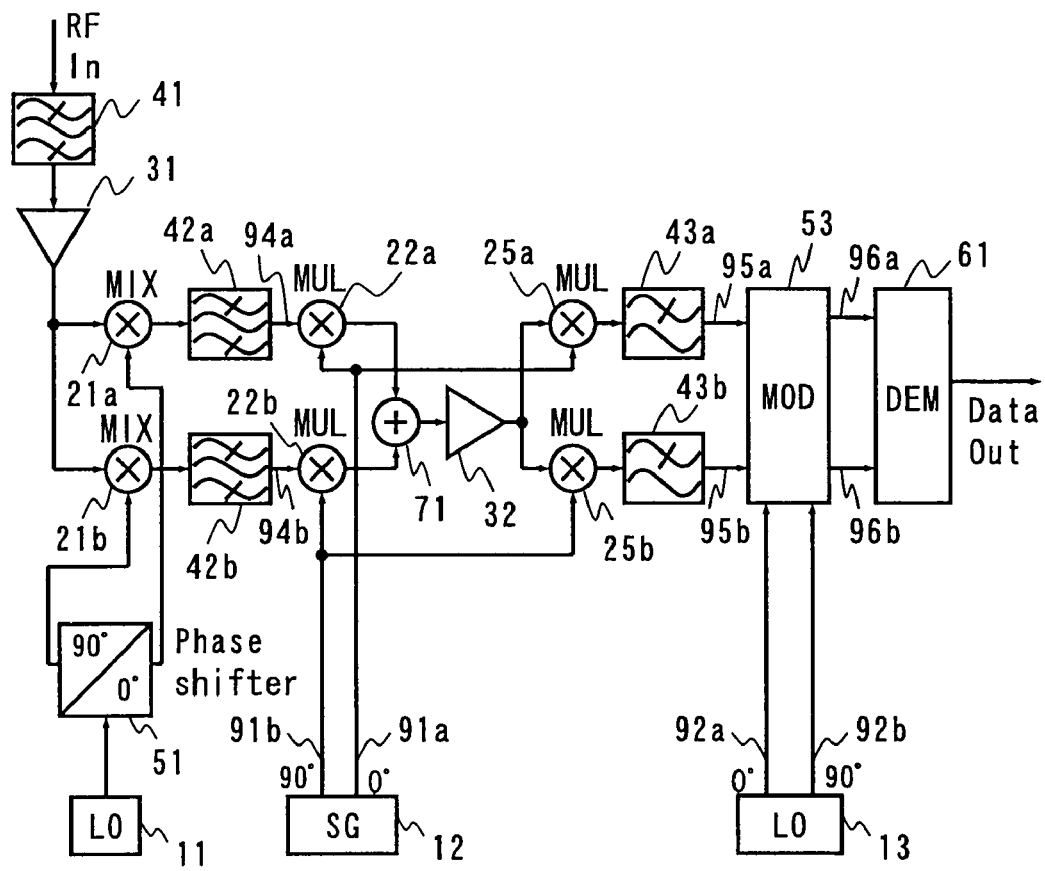
FIG. 1 is a block diagram for showing a configuration of an image signal cancel-type heterodyne reception method according to a first embodiment of the present invention.
Figure 2:
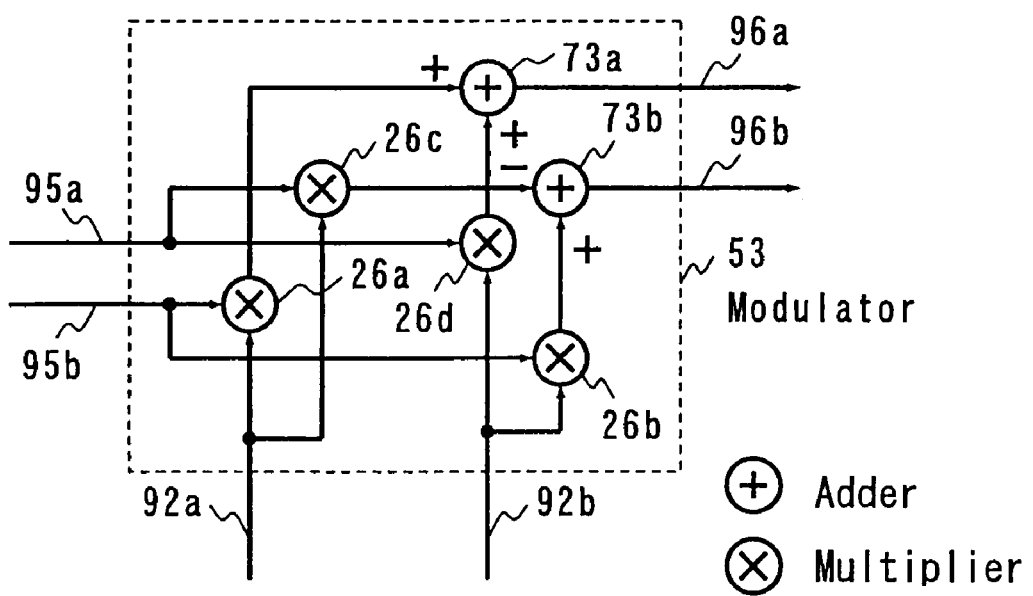
FIG. 2 is a block diagram for showing a modulator according to the first embodiment.

FIG. 1 is a block diagram for showing a configuration of an image signal cancel-type heterodyne reception method according to a first embodiment of the present invention, including a high-frequency signal input component through a digital signal output component of a receiving set for receiving a high-frequency signal which is digital-modulated by quadrature phase shift keying (hereinafter abbreviated as QPSK). FIG. 2 is a block diagram for showing a modulator 53 in FIG. 1. Since an image signal as against an intermediate frequency is offset at adders 73a and 73b in the modulator 53, to obtain a high image signal cancellation ratio, it is necessary to make uniform gains of a high frequency signal with respect to intermediate-frequency amplifier output signals 95a and 95b.

From high-frequency signal received by an antenna etc., a signal of a necessary frequency band is taken out by a band-pass filter 41, amplified by a high-frequency amplifier 31, and supplied to mixers 21a and 21b. A first local oscillator 11 oscillates a signal for converting the received high-frequency signal into an intermediate-frequency signal, which oscillated signal is converted by a phase shifter 51 into two-phase signals whose phases are shifted by 90° from each other and supplied to the mixers 21a and 21b. The mixers 21a and 21b mix the amplified high-frequency signal and the two-phase signals output from the phase shifter 51, to take out signals which have their frequencies as the respective differences between these signals, as two-phase signals. Output signals of the mixers 21a and 21b are input to band-pass filters 42a and 42b, which only a signal desired to be received and its image signal pass through, thus providing intermediate-frequency amplifier input signals 94a and 94b.

An orthogonal signal generator 12 outputs two modulating orthogonal signals 91a and 91b which are orthogonal to each other and have a frequency higher than an intermediate frequency. The intermediate-frequency amplifier input signals 94a and 94b are modulated by multipliers 22a and 22b by using the modulating orthogonal signals 91a and 91b respectively, two modulated signals obtained as a result of which are added up by an adder 71 and amplified by one amplifier 32, which is an intermediate-frequency amplifier. An output signal of the amplifier 32 is modulated by multipliers 25a and 25b by using the modulating orthogonal signals 91a and 91b and passes through low-pass filters 43a and 43b, to generate the intermediate-frequency amplifier output signals 95a and 95b, respectively.

Since the modulating orthogonal signals 91a and 91b are orthogonal to each other, the intermediate-frequency amplifier output signals 95a and 95b have been obtained as a result of amplifying the intermediate-frequency amplifier input signals 94a and 94b respectively. Further, since the two signals have been amplified by the one amplifier 32, it is possible to make uniform a gain of the intermediate-frequency amplifier output signal 95a with respect to the intermediate-frequency amplifier input signal 94a and a gain of the intermediate-frequency amplifier output signal 95b with respect to the intermediate-frequency amplifier input signal 94b.

The intermediate-frequency amplifier output signals 95a and 95b are modulated by the modulator 53 by using two-phase local oscillator output signals 92a and 92b, which are an output of a second local oscillator 13, to have an image signal canceled, thereby providing base-band signals 96a and 96b for the desired receive signal. Since the gain of the intermediate-frequency amplifier output signal 95a with respect to the intermediate-frequency amplifier input signal 94a is equal to the gain of the intermediate-frequency amplifier output signal 95b with respect to the intermediate-frequency amplifier input signal 94b, it is possible to cancel the image signal by using the modulator 53 at a high cancellation ratio. The base-band signals 96a and 96b are input to a demodulator 61 to demodulate the digital signal.

Figure 3:
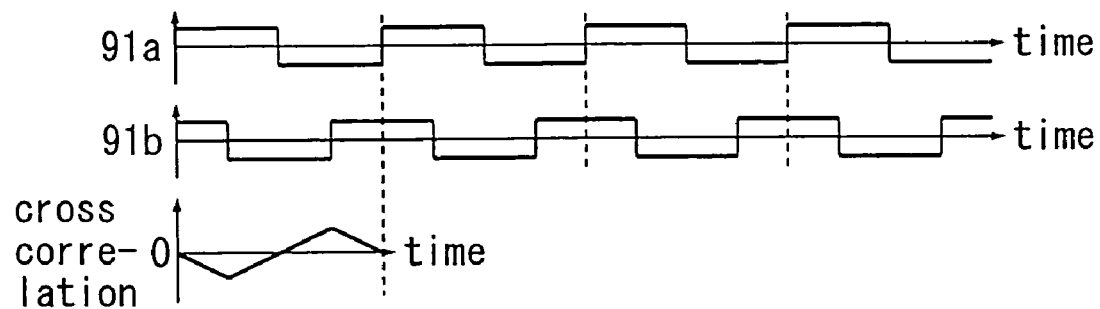
FIG. 3 is a waveform chart for showing a cross correlation between a first example of a modulating orthogonal signal and two modulating orthogonal signals.

The first embodiment of the present invention uses two-phase rectangular waves whose phases are shifted by 90° from each other as shown in FIG. 3, as the modulating orthogonal signals 91a and 91b. By using the rectangular waves which are a two-valued signal, the multipliers 22a, 22b, 25a, and 25b can be realized as analog switches etc., so that it is easy to make uniform the gain of the intermediate-frequency amplifier output signal 95a with respect to the intermediate-frequency amplifier input signal 94a and the gain of the intermediate-frequency amplifier output signal 95b with respect to the intermediate-frequency amplifier input signal 94b. Further, it is also easy to generate the modulating orthogonal signals 91a and 91b by the orthogonal signal generator 12.

Although the first embodiment has used the low-pass filters 43a and 43b, these low-pass-filters 43a and 43b may be replaced by a band-pass filter. Further, the low-pass filters 43a and 43b may be replaced by such an element as to output a value proportional to an average over one or an integral plurality of periods of the modulating orthogonal signals 91a and 91b or such an element as to output a value obtained as a result of performing low-pass or band-pass filter operations on that value.

Further, although outputs of the multipliers 25a and 25b have passed through the low-pass filters 43a and 43b and then entered the modulator 53 in the first embodiment, the output signals of the multipliers 25a and 25b may be directly input to the modulator 53 so that output signals of the modulator 53 would pass through the low-pass filters to have their unnecessary signal components canceled there.

Although the high-frequency signal has undergone frequency conversion once in order to provide the intermediate-frequency amplifier input signals 94a and 94b in the first embodiment, the frequency conversion may be performed a plurality of times to obtain the intermediate-frequency amplifier input signals 94a and 94b from the high-frequency signal.

Figure 4:
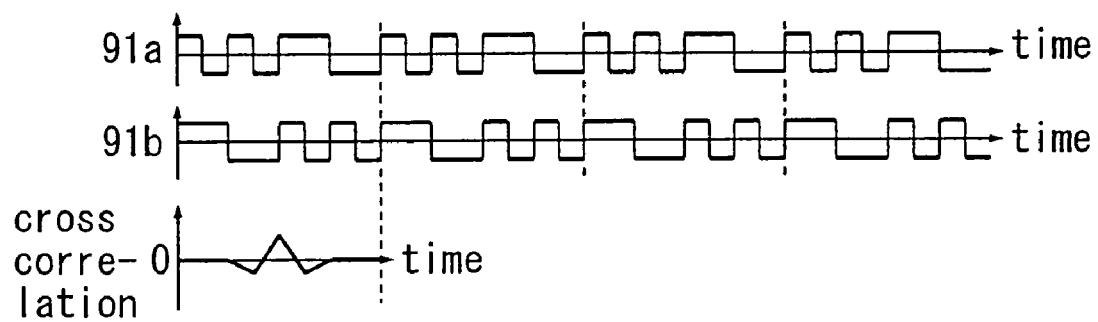
FIG. 4 is a waveform chart for showing a cross correlation between a second example of the modulating orthogonal signal and the two modulating orthogonal signals.

Furthermore, although two-phase rectangular waves have been used as the modulating orthogonal signals 91a and 91b in the first embodiment, they may be mutually orthogonal signals that have an average of zero and do not contain frequency components below the frequency bands of the intermediate-frequency amplifier input signals 94a and 94b or two signals that have different frequencies. Further, the signals may not be of a rectangular wave but may be of a sine wave. Furthermore, as the modulating orthogonal signals 91a and 91b, such signals as shown in FIG. 4 may be used. They are a signal having sequence {1, −1, 1, −1, 1, 1, −1, −1} and a signal whose phase is shifted from it by half a period and has sequence {1, 1, −1, −1, 1, −1, 1, −1}. If such modulating orthogonal signals as shown in FIG. 3 are used, a correlation of these two signals is reduced to zero only at one time difference, so that the signals interfere each other if a phase lag etc. occurs through the amplifier 32. However, if such modulating orthogonal signals as shown in FIG. 4 are used, the signals have complicated waves and the correlation of the two signals is reduced over a wide range of time difference, thus suppressing interference between the signals owing to a phase lag which may occur through the amplifier 32.

Further, in the first embodiment the modulator 53 has been arranged in such a manner that a receive frequency may be a sum of an output frequency of the first local oscillator 11 and that of the second local oscillator 13, the modulator 53 may be arranged in such a manner that the receive frequency would be a difference between the output frequency of the first local oscillator 11 and that of the second local oscillator 13. Further, such a configuration may be employed that in accordance with an intensity of an image signal etc., the receive frequency would be switched between the sum of the output frequency of the first local oscillator 11 and that of the second local oscillator 13 and the difference between them.

Further, although the first embodiment has received a high-frequency signal which is digital-modulated by QPSK, the present invention may be applied to a receiving set for a high-frequency signal which is modulated by any other modulation method, for example, a receiving set for a high-frequency signal which is digital-modulated through π/4-radian shift QPSK or frequency shift keying (hereinafter abbreviated as FSK), and a receiving set for a high-frequency signal which is analog-modulated by frequency modulation (FM). Further, it may be applied to a receiving set for a high-frequency signal which is used in code division communication by means of direct spread.

2. Second Embodiment

Figure 5:
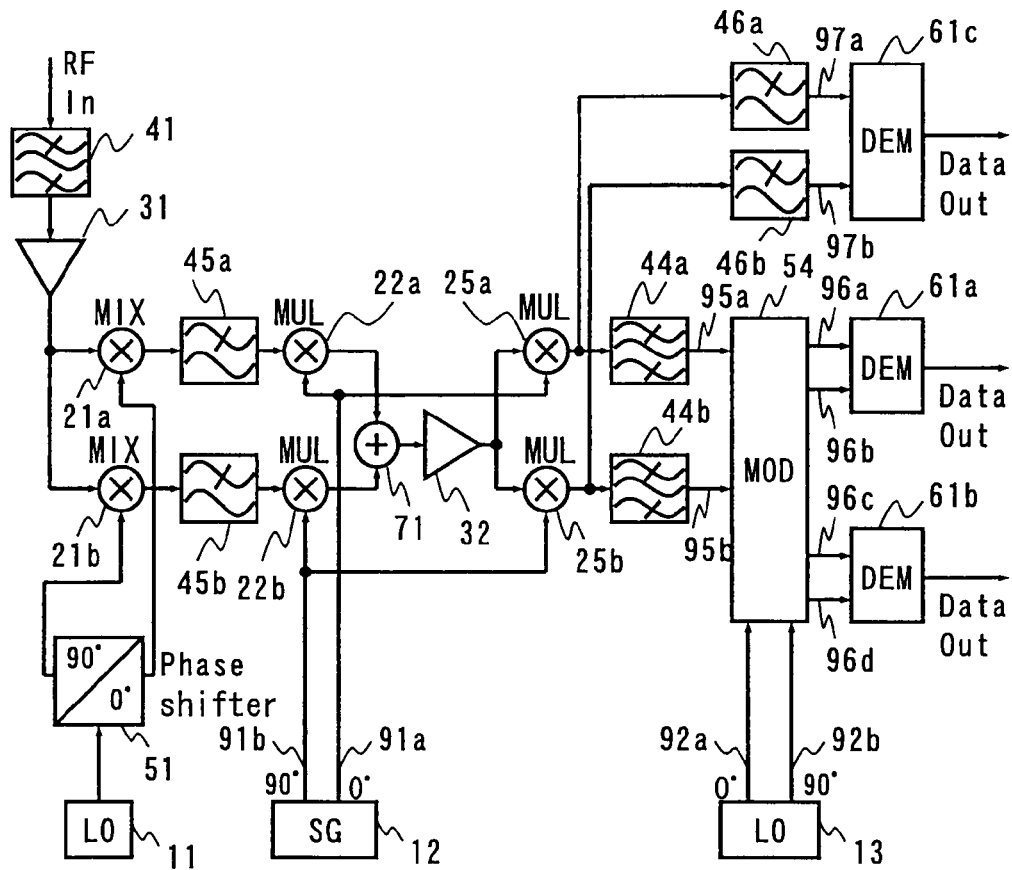
FIG. 5 is a block diagram for showing a configuration of an image signal cancel-type heterodyne reception method according to a second embodiment of the present invention.
Figure 6:
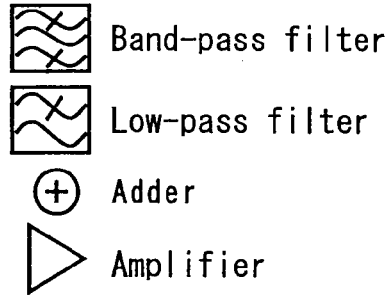
FIG. 6 is a waveform chart for showing a receive signal in the second embodiment.
Figure 7:
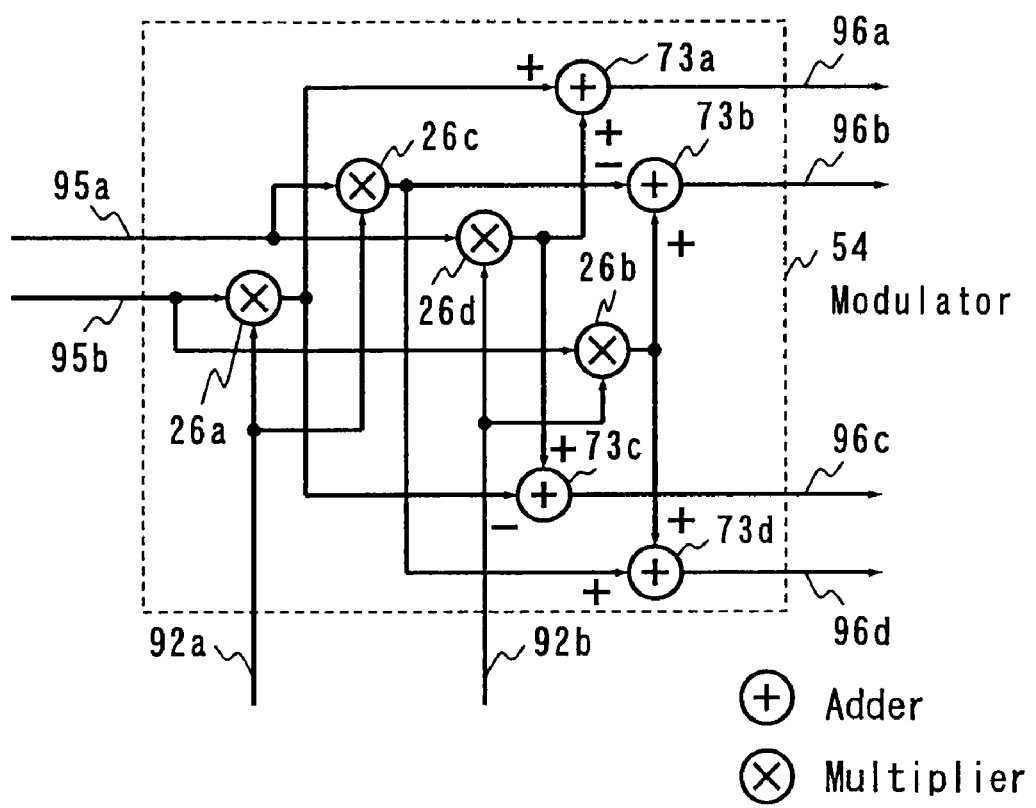
FIG. 7 is a block diagram for showing a modulator according to the second embodiment.

FIG. 5 is a block diagram for showing a configuration of an image signal cancel-type heterodyne reception method according to a second embodiment of the present invention, in which high-frequency signals having three adjacent frequency bands are received simultaneously. A frequency spectrum of a signal to be received is shown in FIG. 6. The signals of the three frequency bands are obtained by modulating a digital signal. The signal of the central frequency band that has fc as its center frequency is received by direct conversion, while the signal of the band that is on one side of the central frequency band and has fc+fs as its center frequency and the signal of the band that is on other side of the central frequency band and has fc−fs as its center frequency are received by an image signal cancel-type heterodyne reception method. It is to be noted that an oscillation frequency of a first local oscillator 11 is fc and that of a second local oscillator 13 is fs. FIG. 7 shows a specific example of a modulator 54 shown in FIG. 5.

The received high-frequency signal passes through a band-pass filter 41 and a high-frequency amplifier 31 and enters mixers 21a and 21b, where it is modulated using two-phase signals having frequency fc. Low-pass filters 45a and 45b permit only signals having a frequency of 1.5*fs or less to pass therethrough, so that output signals of the low-pass filters 45a and 45b contain only the signals of the three frequency bands desired to be received. The output signals of the low-pass filters 45a and 45b are modulated using modulating orthogonal signals 91a and 91b, amplified by one amplifier 32, and modulated by multipliers 25a and 25b again by using modulating orthogonal signals 91a and 91b respectively, thereby providing the amplified output signals with respect to the low-pass filters 45a and 45b.

Signal components having a frequency of fs/2 or less contained in output signals of the multipliers 25a and 25b have the central frequency band shown in FIG. 6 and so are taken out by low-pass filters 46a and 46b and demodulated by a demodulator 61c into a digital signal.

The signal components of both side frequency bands in FIG. 6, on the other hand, have a frequency between fs/2 and 1.5*fs in the output signals of the multipliers 25a and 25b. Therefore, band-pass filters 44a and 44b are used to take out such signal components as to have a frequency between fs/2 and 1.5*fs and the modulator 54 is used to take out signal components of the right-side frequency band in FIG. 6 as base-band signals 96a and 96b and, simultaneously, signal components of the left-side frequency band in FIG. 6 as base-band signals 96c and 96d.

Although signals of the three adjacent frequency bands have been received in the second embodiment, signals of two adjacent frequency bands may be received. In this case, the signal of either one of the frequency bands may be received by a direct conversion method and the signal of the other frequency band may be received by the image signal cancel-type heterodyne reception method; in this case, however, it is recommended to set the oscillation frequency of the first local oscillator 11 to an average of center frequencies of the two frequency bands and that of the second local oscillator 13 to half a difference between the center frequencies of the two frequency bands, thus receiving both of the signals of the two frequency bands by the image signal cancel-type heterodyne reception method. Further, signals of two frequency bands not adjacent to each other may be received. In this case, to cut off an unnecessary signal between the two frequency bands by setting the oscillation frequency of the first local oscillator 11 to an average of center frequencies of the two frequency bands and that of the second local oscillator 13 to half a difference between the center frequencies of the two frequency bands, the low-pass filters 45a and 45b in FIG. 5 is replaced by a band-pass filter. Furthermore, output signals having a plurality of frequencies may be provided by the second local oscillator 13, to receive signals of three frequency bands or more by the image signal cancel-type heterodyne reception method.

3. Third Embodiment

Figure 8:
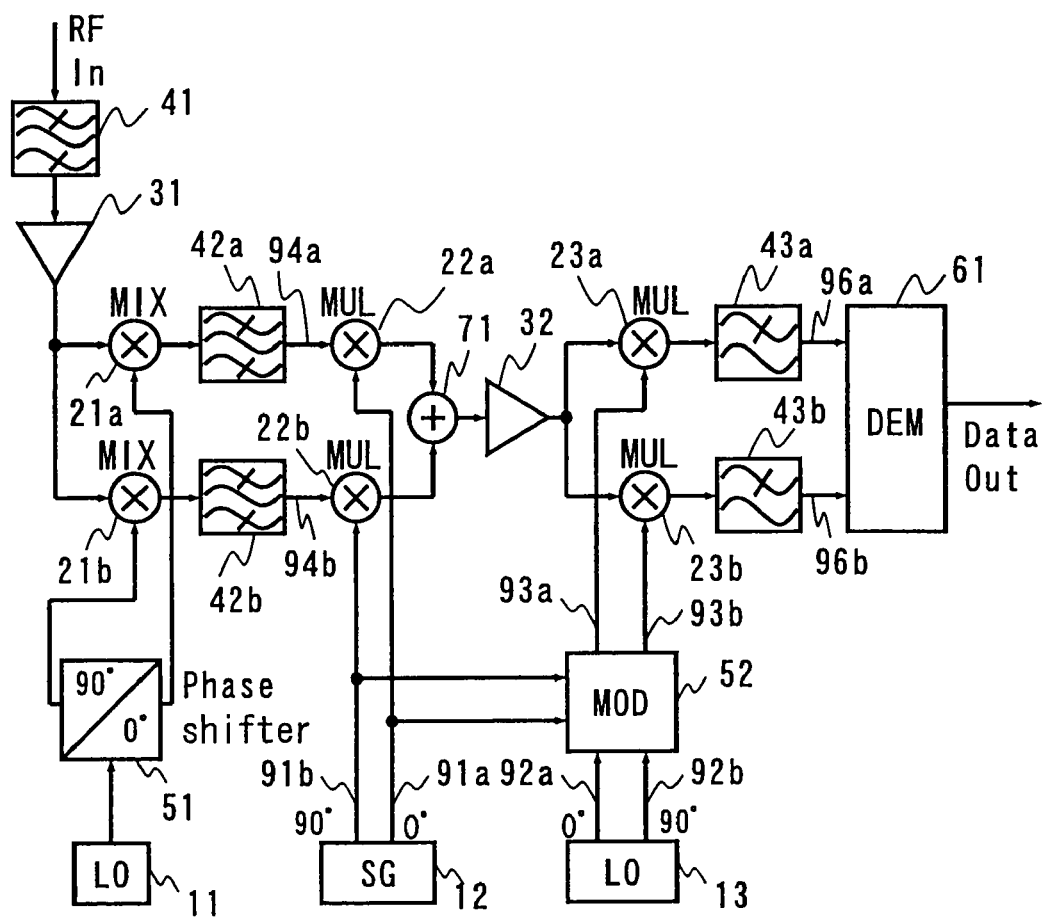
FIG. 8 is a block diagram for showing a configuration of an image signal cancel-type heterodyne reception method according to a third embodiment of the present invention.

FIG. 8 is a block diagram for showing a configuration of an image signal cancel-type heterodyne reception method according to a third embodiment of the present invention, including a high-frequency signal input component through a digital signal output component of a receiving set for receiving a high-frequency signal which is digital-modulated by QPSK. Many of its basic operations are the same as those of the first embodiment of the present invention, with an exception that base-band signals 96a and 96b are obtained from an output signal of an amplifier 32 not by generating intermediate-frequency amplifier output signals 95a and 95b in the third embodiment unlike the first embodiment, in which the intermediate-frequency amplifier output signals 95a and 95b are once generated and the base-band signals 96a and 96b are obtained. The following will describe operations of the third embodiment different from those of the first embodiment.

For convenience of the description, it is assumed that an output signal of the amplifier 32 is x(t), modulating orthogonal signals 91a and 91b are ma(t) and mb(t), and local oscillator output signals 92a and 92b are va(t) and vb(t) respectively.

In the first embodiment, if the low-pass filters 43a and 43b are placed on an output side of the modulator 53, the base-band signals 96a and 96b are obtained by causing signals ya(t) and yb(t) given by the following equations 3 and 4 to pass through the low-pass filter.

$$ya(t)=vb(t)\{ma(t) \times (t)\}+va(t)\{mb(t) \times (t)\} \quad \text{[Equation 3]}$$

$$yb(t)=vb(t)\{mb(t) \times (t)\}-va(t)\{ma(t) \times (t)\} \quad \text{[Equation 4]}$$

Equations 3 and 4 have a common factor in their terms 1 and 2. Further, since the same results are obtained even if a multiplication order is permuted, signals wa(t) and wb(t) defined by the following equations 5 and 6 can be used to obtain ya(t) and yb(t) as indicated by the following equations 7 and 8.

$$wa(t)=vb(t)ma(t)+va(t)mb(t) \quad \text{[Equation 5]}$$

$$wb(t)=vb(t)mb(t)-va(t)ma(t) \quad \text{[Equation 6]}$$

$$ya(t)=wa(t) \times (t) \quad \text{[Equation 7]}$$

$$yb(t)=wb(t) \times (t) \quad \text{[Equation 8]}$$

Figure 9:
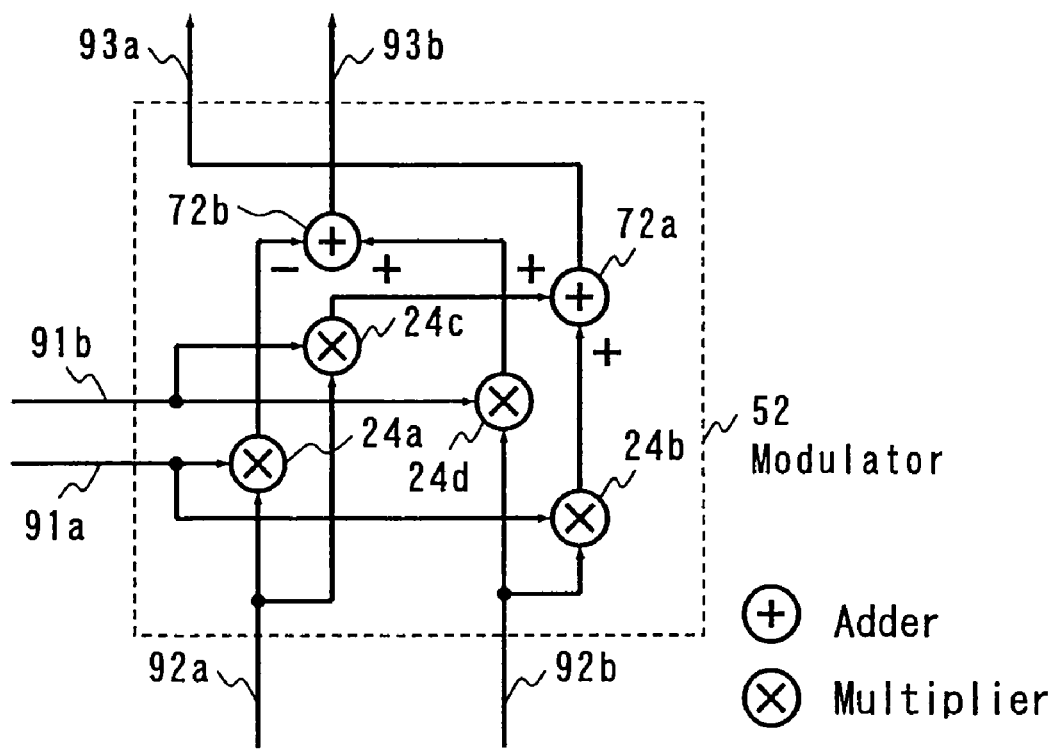
FIG. 9 is a block diagram for showing a modulator according to the third embodiment.

In contrast, in the third embodiment, as base-band signal detecting modulated signals 93a and 93b, wa(t) and wb(t) are generated by a modulator 52 so that they may undergo operations of Equations 7 and 8 at multipliers 23a and 23b. The modulator 52 is used to perform operations of Equations 5 and 6, a specific example of which is shown in FIG. 9.

By using two-valued signals such as two-phase rectangular waves as the modulating orthogonal signals 91a and 91b and using two-phase rectangular waves as the local oscillator output signals 92a and 92b, the base-band signal detecting modulated signals 93a and 93b are converted into three-valued signal $\{-a, 0, a\}$ (where a is a constant), so that the multipliers 23a and 23b can be realized as an analog switch, etc. Furthermore, by synchronizing the modulating orthogonal signals 91a and 91b with the local oscillator output signals 92a and 92b, the multipliers 23a and 23b and the low-pass filters 43a and 43b can be realized as switched capacitor circuits, respectively.

Although a frequency of a high-frequency signal has been converted once to obtain intermediate-frequency amplifier input signals 94a and 94b in the third embodiment, the frequency conversion may be performed a plurality of times to obtain the intermediate-frequency amplifier input signals 94a and 94b from the high-frequency signal.

Furthermore, although two-phase rectangular waves have been used as the modulating orthogonal signals 91a and 91b in the third embodiment, they may be mutually orthogonal signals that have an average of zero and do not contain frequency components in frequency bands or less of the intermediate-frequency amplifier input signals 94a and 94b or two signals that have different frequencies. Further, the signals may not be of a rectangular wave but may be of a sine wave. Further, as the modulating orthogonal signals 91a and 91b, such signals as shown in FIG. 4 may be used.

Furthermore, although the third embodiment has received a high-frequency signal which is digital-modulated by QPSK, the present invention may be applied to a receiving set for a high-frequency signal which is modulated by any other modulation method, for example, a receiving set for a high-frequency signal which is digital-modulated through π/4-radian shift QPSK or FSK, and a receiving set for a high-frequency signal which is analog-modulated by FM. Further, it may be applied to a receiving set for a high-frequency signal which is used in code division communication by means of direct spread.

4. Fourth Embodiment

Figure 10:
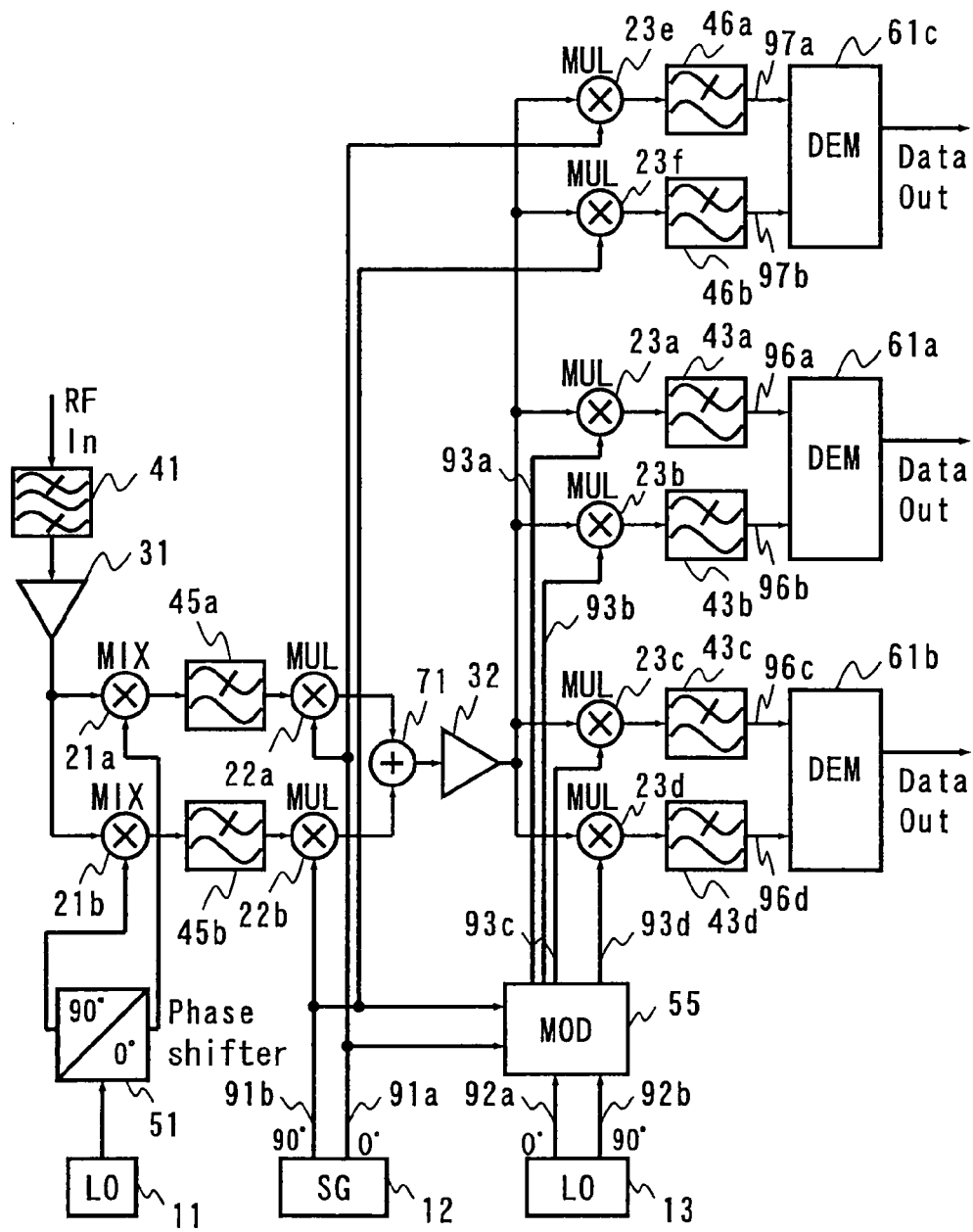
FIG. 10 is a block diagram for showing a configuration of an image signal cancel-type heterodyne reception method according to a fourth embodiment of the present invention.
Figure 11:
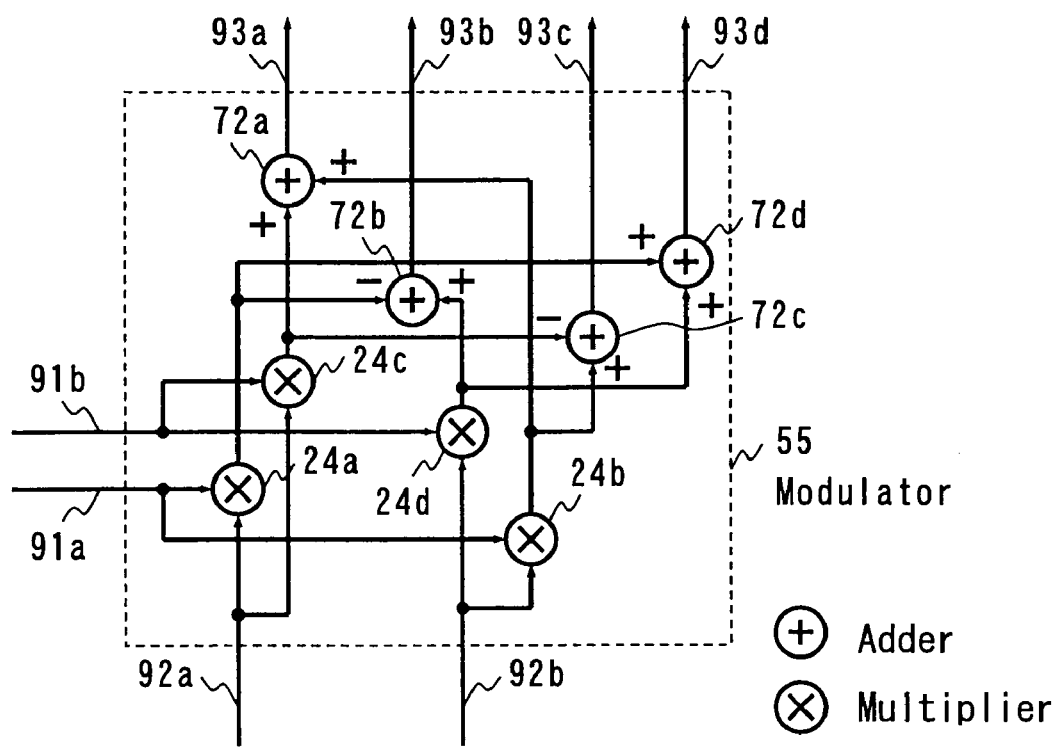
FIG. 11 is a block diagram for showing a modulator according to the fourth embodiment.

FIG. 10 is a block diagram for showing a configuration of an image signal cancel-type heterodyne reception method according to a fourth embodiment of the present invention, in which high-frequency signals having three adjacent frequency bands are received simultaneously. A frequency spectrum of a signal to be received is the same as that shown in FIG. 6. The signals of the three frequency bands are obtained by modulating a digital signal. The signal of the central frequency band that has fc as its center frequency is received by direct conversion method, while the signal of the band that is on one side of the central frequency band and has fc+fs as its center frequency and the signal of the band that is on other side of the central frequency band and has fc−fs as its center frequency are received by the image signal cancel-type heterodyne reception method. It is to be noted that an oscillation frequency of a first local oscillator 11 is fc and that of a second local oscillator 13 is fs. FIG. 11 shows a specific example of a modulator 55 shown in FIG. 10.

The received high-frequency signal passes through a band-pass filter 41 and a high-frequency amplifier 31 and enters mixers 21a and 21b, where it is modulated using two-phase signals having frequency fc. Low-pass filters 45a and 45b permit only signals having a frequency of 1.5*fs or less to pass therethrough, so that output signals of the low-pass filters 45a and 45b contain only the signals of the three frequency bands desired to be received. The output signals of the low-pass filters 45a and 45b are modulated using modulating orthogonal signals 91a and 91b and amplified by an amplifier 32.

When an output signal of the amplifier 32 is modulated by multipliers 23e and 23f by using the modulating orthogonal signals 91a and 91b again, its signal components that have a frequency of fs/2 or less are the base-band signal of the central frequency band in FIG. 6 and so taken out by low-pass filters 46a and 46b and demodulated by a demodulator 61c into a digital signal.

Signal components of the right-side frequency band in FIG. 6, on the other hand, are modulated by multipliers 23a and 23b by using base-band signal detecting modulated signals 93a and 93b, so that its base-band signal is taken out. In this case, the signal component of the central frequency band in FIG. 6 is mixed in it but has the frequency of fs/2 or higher; therefore, only such signal components as to have a frequency of less than fs/2 are take out by low-pass filters 43a and 43b and input to a demodulator 61a as a base-band signal corresponding to the signal component of the right-side frequency band in FIG. 6, to demodulate the digital signal. Similarly, the signal components of the left-side frequency band in FIG. 6 are also modulated by multipliers 23c and 23d by using base-band signal detecting modulated signals 93c and 93d and enter low-pass filters 43c and 43d, where only such signal components of them as to have the frequency of fs/2 or less are taken out therethrough and then input to a demodulator 61b as a base-band signal corresponding to the signal component of the left-side frequency band in FIG. 6, to demodulate the digital signal.

Although signals of the three adjacent frequency bands have been received in the fourth embodiment of the present invention, signals of two adjacent frequency bands may be received. In this case, the signal of either one of the frequency bands may be received by the direct conversion method and the signal of the other frequency band may be received by the image signal cancel-type heterodyne reception method; in this case, however, it is recommended to set the oscillation frequency of the first local oscillator 11 to an average of center frequencies of the two frequency bands and that of the second local oscillator 13 to half a difference between the center frequencies of the two frequency bands, thus receiving both of the signals of the two frequency bands by the image signal cancel-type heterodyne reception method. Further, signals of two frequency bands not adjacent to each other may be received. In this case, to cut off an unnecessary signal between the two frequency bands by setting the oscillation frequency of the first local oscillator 11 to an average of center frequencies of the two frequency bands and that of the second local oscillator 13 to half a difference between the center frequencies of the two frequency bands, the low-pass filters 45a and 45b in FIG. 10 is replaced by a band-pass filter. Furthermore, output signals having a plurality of frequencies may be provided by the second local oscillator 13, to receive signals of three frequency bands or more by the image signal cancel-type heterodyne reception method.

5. Fifth Embodiment

Figure 12:
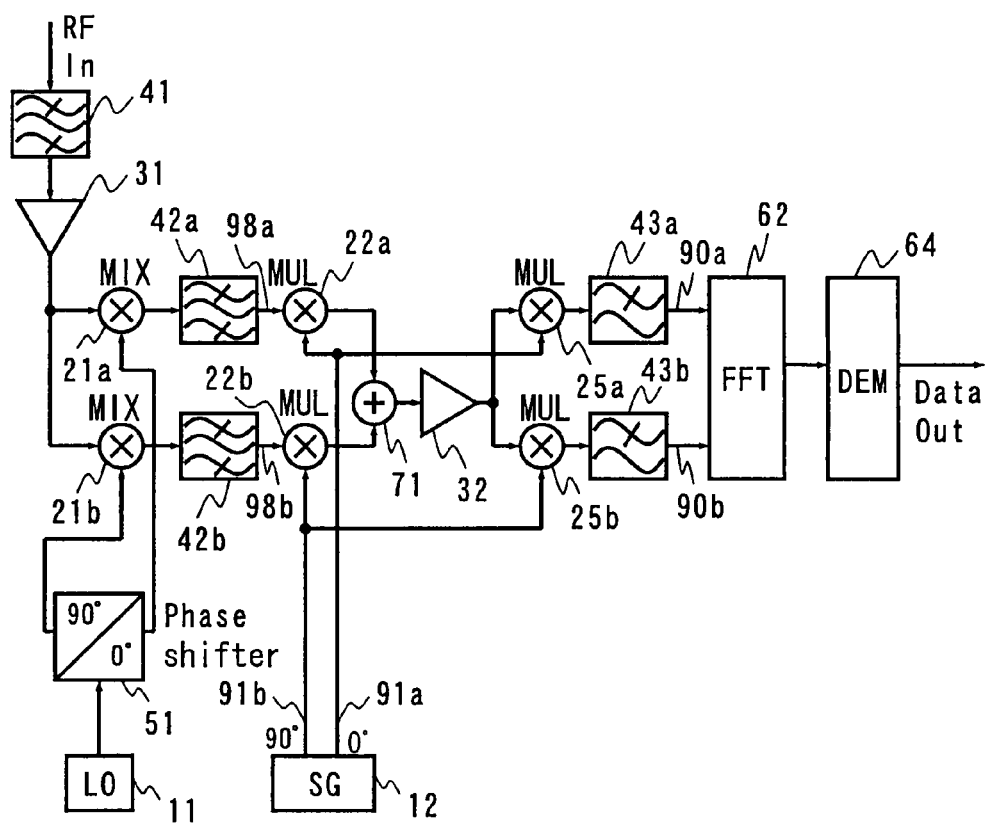
FIG. 12 is a block diagram for showing a configuration of a direct conversion orthogonal frequency division multiplexing reception method according to a fifth embodiment of the present invention.

FIG. 12 is a block diagram for showing a configuration of a direct conversion orthogonal frequency division multiplexing reception method according to a fifth embodiment, including a high-frequency signal input component through a symbol data output component of a receiving set for receiving a high-frequency signal which is modulated by OFDM.

From high-frequency signal components received by an antenna etc., a signal of a necessary frequency band is taken out by a band-pass filter 41, amplified by a high-frequency amplifier 31, and supplied to mixers 21a and 21b. A first local oscillator 11 oscillates a signal for converting the received high-frequency signal into a base-band signal, which oscillated signal is converted by a phase shifter 51 into two-phase signals whose phases are shifted by 90° from each other and supplied to the mixers 21a and 21b. The mixers 21a and 21b mix the amplified high-frequency signal and the two-phase signals output from the phase shifter 51, to take out base-band signals as two-phase signals. Output signals of the mixers 21a and 21b are input to band-pass filters 42a and 42b, which only a signal desired to be received passes through, thus providing base-band signals 98a and 98b.

Figure 13:
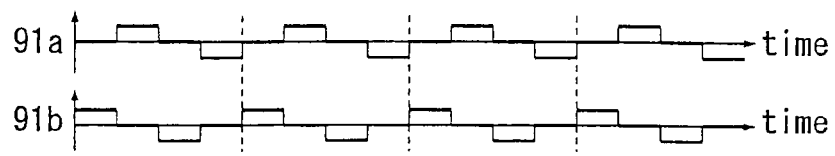
FIG. 13 is a graph for showing a modulating orthogonal signal in the fifth embodiment.

An orthogonal signal generator 12 outputs two modulating orthogonal signals 91a and 91b which are orthogonal to each other and have a frequency higher than a maximum frequency of a sub-carrier. In this embodiment, tree-values signals having sequences {0, 1, 0, −1} and {1, 0, −1, 0} respectively such as shown in FIG. 13 are used. A sampling frequency for these signals is supposed to be twice a sampling frequency used by an FFT operator 62.

The base-band signals 98a and 98b are modulated by multipliers 22a and 22b by using the modulating orthogonal signals 91a and 91b respectively, two modulated signals obtained as a result of which are added up by an adder 71 and amplified by one amplifier 32. An output signal of the amplifier 32 is modulated by multipliers 25a and 25b by using the modulating orthogonal signals 91a and 91b and passes through low-pass filters 43a and 43b, to generate two-phase base-band output signals 90a and 90b, respectively.

Since the modulating orthogonal signals 91a and 91b are orthogonal to each other, the base-band output signals 90a and 90b have been obtained as a result of amplifying the base-band signals 98a and 98b respectively. Further, since the two signals have been amplified by the one amplifier 32, it is possible to make uniform a gain of the base-band output signal 90a with respect to the base-band signal 98a and a gain of the base-band output signal 90b with respect to the base-band signal 98b.

By using the three-valued signals having sequences {0, 1, 0, −1} and {1, 0, −1, 0} such as shown in FIG. 13 as the modulating orthogonal signals 91a and 91b respectively as described above, it is possible to realize the multipliers 22a and 22b as analog switches and also to realize the low-pass filters 43a and 43b as a sample-and-hold device or a combination of analog switches and an integrator.

The base-band output signals 90a and 90b undergo sampling and FFT operations by the FFT operator 62. A value of the base-band output signal 90a is handled as a real part and that of the base-band output signal 90b is handled as an imaginary part. In this case, since the gain of the base-band output signal 90a with respect to the base-band signal 98a is equal to the gain of the base-band output signal 90b with respect to the base-band signal 98b, it is possible to suppress interference between the sub-carriers. An output signal of the FFT operator 62 is sent to a demodulator 64, which provides a decided symbol as output data.

To use the three-valued signals having sequences {0, 1, 0, −1} and {1, 0, −1, 0} such as shown in FIG. 13 as the modulating orthogonal signals 91a and 91b respectively as described above has a merit that it is possible to eliminate an essential influence of crosstalk on amplification of the base-band output signal 90a with respect to the base-band signal 98a and amplification of the base-band output signal 90b with respect to the base-band signal 98b. That is, if a phase lag of the amplifier 32 is sufficiently small in an amplification frequency band, such crosstalk is sufficiently small; otherwise, crosstalk occurs.

An amplification factor of the base-band output signal 90a with respect to the base-band signal 98a and an amplification factor of the base-band output signal 90b with respect to the base-band signal 98b are both supposed to be equal to gc. If a crosstalk amplification factor of the base-band output signal 90b with respect to the base-band signal 98a is supposed to be j*gd (gd is a real number, so that the crosstalk amplification factor becomes a purely imaginary number), owing to properties of the modulating orthogonal signals 91a and 91b, the crosstalk amplification factor of the base-band output signal 90a with respect to the base-band signal 98b becomes −j*gd. Accordingly, frequency-f1 components contained in the base-band output signals 90a and 90b are each given by the following equation 9:

$$(gc+j*gd)*Re\{pa*sa+pb*sb\}+(j*gc-gd)*Im\{pa*sa-pb*sb\}$$

$$(gc+j*gd)*Re\{pa*sa-pb*sb\}-(j*gc-gd)*Im\{pa*sa+pb*sb\} \quad \text{[Equation 9]}$$

Therefore, spectra of frequencies f1 and f2 actually calculated by the FFT operator 62 are each such as given by the following equation 10, so that a phase is turned by ∠(gc+j*gd) with respect to a value to be calculated by the FFT operator 62 originally.

$$(gc+j*gd)*pa*sa,$$

$$(gc+j*gd)*pb*sb \quad \text{[Equation 10]}$$

Originally, phase angles of pa and pb are not known and their values must be estimated by an equalizer. Phase angles which are turned owing to crosstalk have an influence on phase angles of pa and pb in that they are all added to them and take on a constant value, so that by estimating values of ∠pa*(gc+j*gd) and ∠pb*(gc+j*gd) by the equalizer, an influence of the crosstalk can be eliminated essentially.

Although in the fifth embodiment, three-valued signals having sequences {0, 1, 0, −1} and {1, 0, −1, 0} such as shown in FIG. 13 have been used as the modulating orthogonal signals 91a and 91b respectively, any other types of orthogonal signals may be used; for example, the rectangular waves whose phases are shifted by a quarter period from each other such as shown in FIG. 3 may be used or signals having such waves as shown in FIG. 4 may be used.

6. Sixth Embodiment

Figure 14:
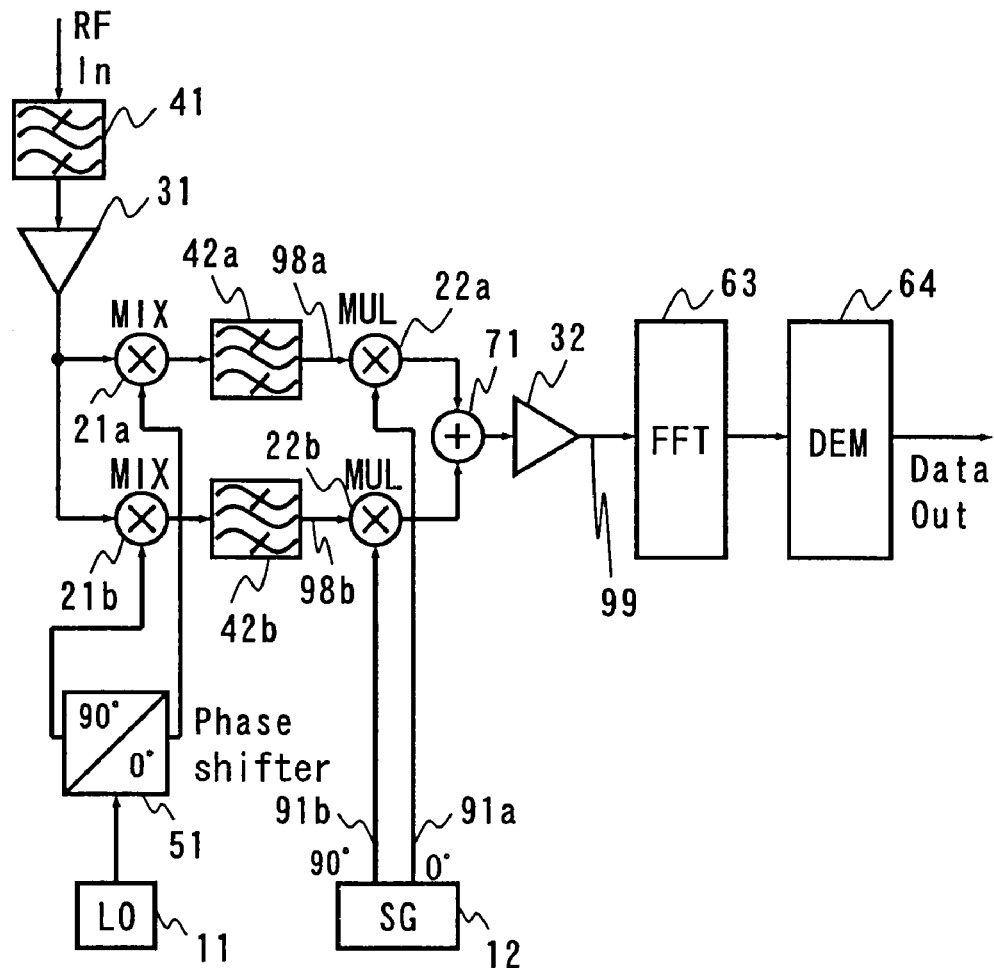
FIG. 14 is a block diagram for showing a configuration of a direct conversion orthogonal frequency division multiplexing reception method according to a sixth embodiment of the present invention.

FIG. 14 is a block diagram for showing a configuration of a direct conversion orthogonal frequency division multiplexing reception method according to a sixth embodiment of the present invention, including a high-frequency signal input component through a symbol data output component of a receiving set for receiving a high-frequency signal which is modulated by OFDM.

From high-frequency signal components received by an antenna etc., a signal of a necessary frequency band is taken out by a band-pass filter 41, amplified by a high-frequency amplifier 31, and supplied to mixers 21a and 21b. A first local oscillator 11 oscillates a signal for converting the received high-frequency signal into a base-band signal, which oscillated signal is converted by a phase shifter 51 into two-phase signals whose phases are shifted by 90° from each other and supplied to the mixers 21a and 21b. The mixers 21a and 21b mix the amplified high-frequency signal and the two-phase signals output from the phase shifter 51, to take out base-band signals as two-phase signals. Output signals of the mixers 21a and 21b are input to band-pass filters 42a and 42b, which only a signal desired to be received passes through, thus providing base-band signals 98a and 98b.

The base-band signals 98a and 98b are modulated by multipliers 22a and 22b by using modulating orthogonal signals 91a and 91b respectively, two modulated signals obtained as a result of which are added up by an adder 71 and amplified by one amplifier 32.

Figure 15:
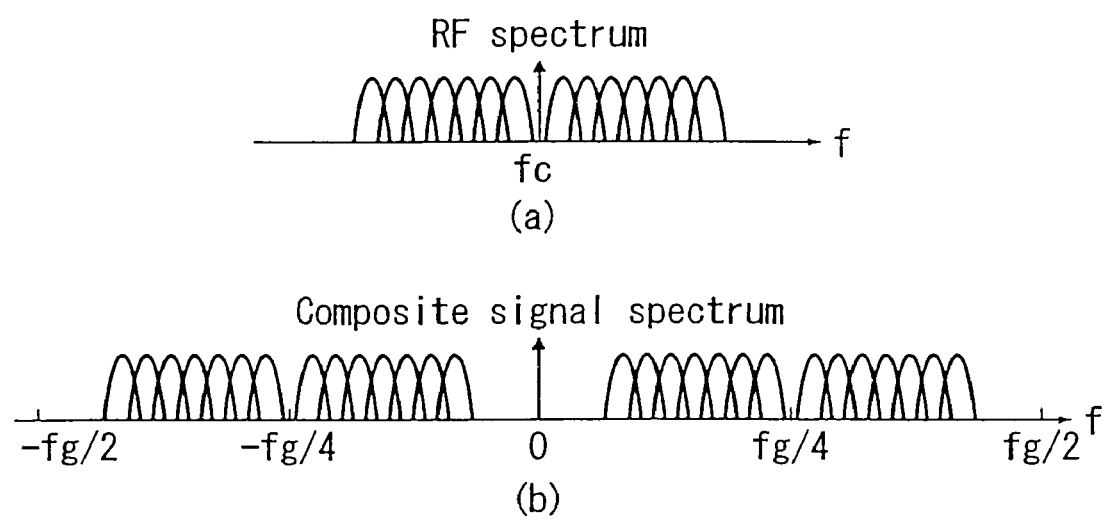
FIG. 15 is a waveform chart for showing a signal spectrum in the sixth embodiment.
Figure 16:
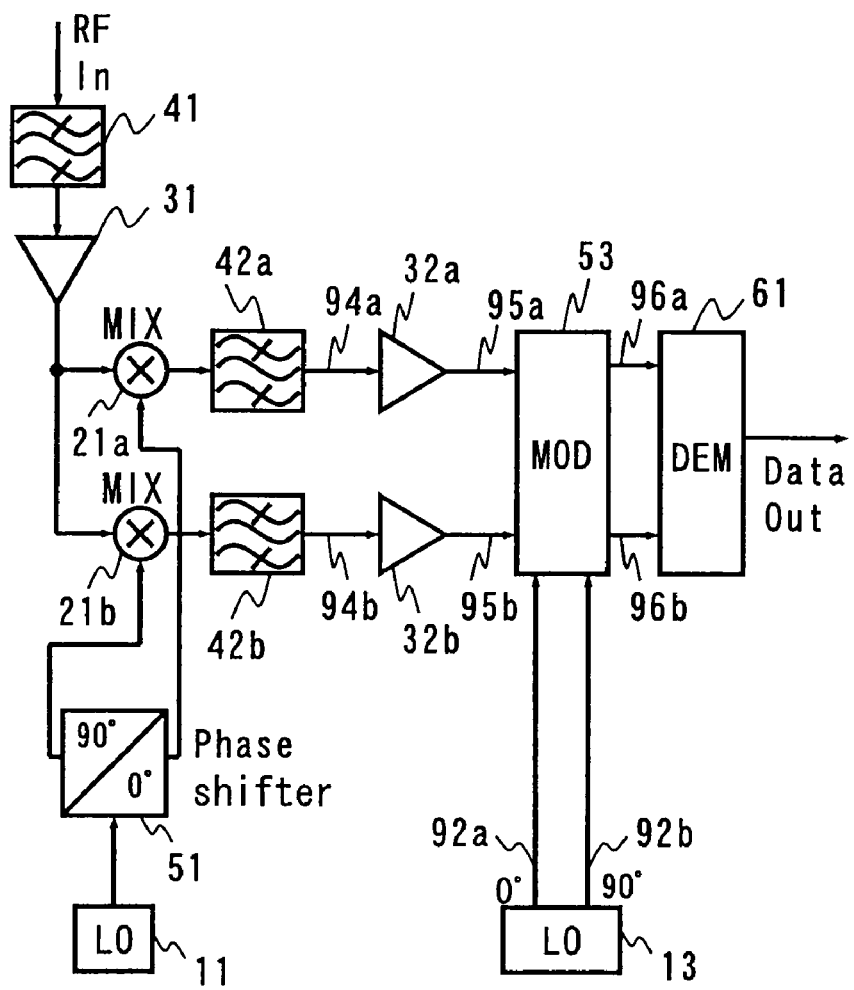
FIG. 16 is a block diagram for showing a configuration of a conventional image signal cancel-type heterodyne reception method.
Figure 17:
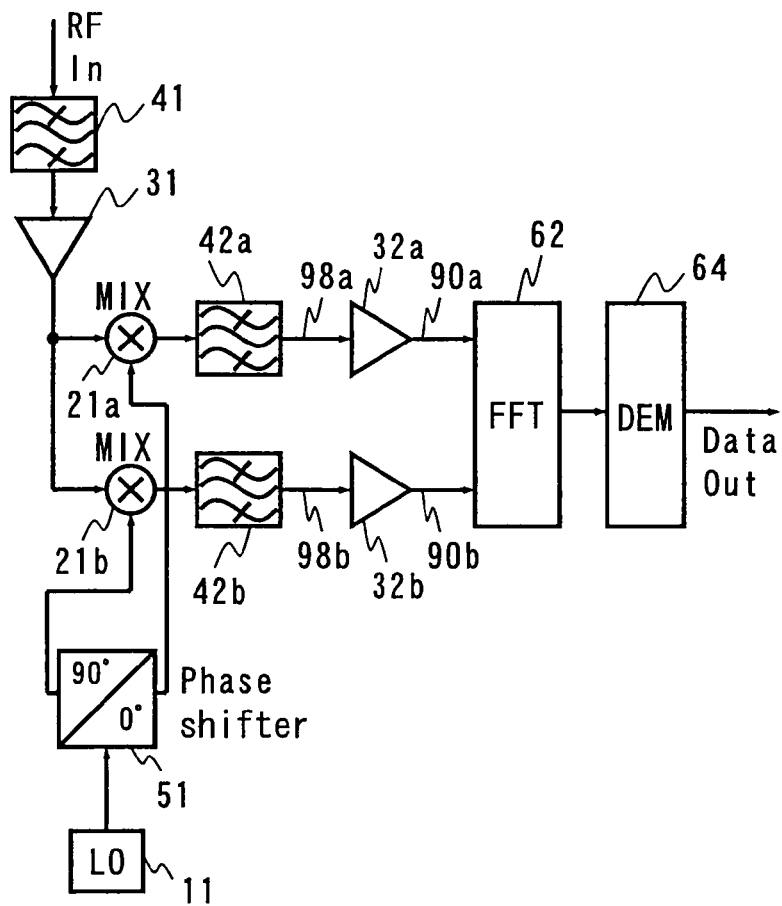
FIG. 17 is a block diagram for showing a configuration of a conventional direct conversion orthogonal frequency division multiplexing reception method.

An orthogonal signal generator 12 outputs the two modulating orthogonal signals 91a and 91b which are orthogonal to each other and have a frequency higher than a maximum frequency of a sub-carrier. In this embodiment, tree-valued signals having sequences {0, 1, 0, −1} and {1, 0, −1, 0} respectively such as shown in FIG. 13 are used. A sampling frequency for these signals is supposed to be same as a sampling frequency used by an FFT operator 62. Accordingly, a synthesized base-band signal has such a spectrum as shown in FIG. 15B as against a spectrum of the base-band signal such as shown in FIG. 15A. By virtue of symmetry of the spectra, it is possible to calculate the spectrum of the base-band signal from the spectrum of the synthesized base-band signal, which is a scalar signal. That is, by sampling the synthesized base-band signal at sampling frequency fg and subjecting it to FFT to thereby calculate the spectrum of the synthesized base-band signal and shift the resultant data by fg/4 in a frequency direction, the spectrum of the base-band signal can be obtained. This FFT operation is performed on the scalar signal having a real number and so can be done so more efficiently than FFT operations on a complex-number signal. An output of the FFT operator 63 is sent to a demodulator 64, which provides a decided symbol as output data.

Although in the sixth embodiment, three-valued signals having sequences {0, 1, 0, −1} and {1, 0, −1, 0} such as shown in FIG. 13 have been used as the modulating orthogonal signals 91a and 91b respectively, the rectangular waves whose phases are shifted by a quarter period from each other such as shown in FIG. 3 may be used or sine-wave signals whose phases are shifted by a quarter period from each other may be used.

According to the image signal cancel-type heterodyne reception method of the present invention, it is possible to amplify each of two-phase intermediate-frequency signals by one amplifier, thereby realizing a high image signal cancellation ratio. According to the direct conversion orthogonal frequency division multiplexing reception method of the present invention, on the other hand, it is possible to amplify each of two base-band signals by one amplifier, thereby realizing high non-interference between sub-carriers. Therefore, those reception methods both enable avoiding use of a surface-acoustic-wave filter in an intermediate-frequency circuit, thus being effective in downsizing of a receiving set in radio equipment such as a cellular phone.

What is claimed is:

1. An image signal cancel-type heterodyne reception method comprising the steps of:
    mixing a high-frequency signal received and amplified with locally oscillated two-phase output signals of a first local oscillator which have different phases, to generate two-phase intermediate-frequency signals;
    summing a pair of modulated signals of the two-phase intermediate-frequency signals which are modulated using two modulating orthogonal signals which are orthogonal to each other, to generate one synthesized signal;
    amplifying the synthesized signal to generate a synthesized-signal amplifier output signal; and
    modulating the synthesized-signal amplifier output signal by using signals obtained by modulating two-phase output signals of a second local oscillator which have different phases by using the modulating orthogonal signals, to generate a desired base-band signal from which an image signal has been canceled, thus demodulating the base-band signal.

2. The image signal cancel-type heterodyne reception method according to claim 1, wherein signals of two frequency bands which act as an image signal to each other are received simultaneously.

3. The image signal cancel-type heterodyne reception method according to claim 2, wherein rectangular waves or sine waves whose phases are shifted by 90° from each other are used as the two modulating orthogonal signals which are orthogonal to each other.

4. The image signal cancel-type heterodyne reception method according to claim 2, wherein two-valued signals having sequences $\{1, -1, 1, -1, 1, 1, -1, -1\}$ and $\{1, 1, -1, -1, 1, -1, 1, -1\}$ respectively are used as the two modulating orthogonal signals which are orthogonal to each other.

5. The image signal cancel-type heterodyne reception method according to claim 1, wherein rectangular waves or sine waves whose phases are shifted by 90° from each other are used as the two modulating orthogonal signals which are orthogonal to each other.

6. The image signal cancel-type heterodyne reception method according to claim 1, wherein two-valued signals having sequences $\{1, -1, 1, -1, 1, 1, -1, -1\}$ and $\{1, 1, -1, -1, 1, -1, 1, -1\}$ respectively are used as the two modulating orthogonal signals which are orthogonal to each other.

* * * * *